United States Patent [19]

Berger

[11] 4,164,665
[45] Aug. 14, 1979

[54] MANUALLY PROGRAMMABLE STORAGE DEVICE

[75] Inventor: Hans Berger, Schönaich, Fed. Rep. of Germany

[73] Assignee: Centra-Bürkle GmbH & Co., Schönaich, Fed. Rep. of Germany

[21] Appl. No.: 844,846

[22] Filed: Oct. 25, 1977

[30] Foreign Application Priority Data

Oct. 22, 1976 [DE] Fed. Rep. of Germany ....... 2647829

[51] Int. Cl.² .............................................. H01H 7/00
[52] U.S. Cl. .................................. 307/141; 339/18 C; 340/309.1; 361/413
[58] Field of Search ................... 307/141, 141.4, 141.8; 340/309.1, 309.6; 339/18 C, 18 P; 200/16 B, 16 C, 16 F; 361/352, 395, 397, 399, 413, 410, 416

[56] References Cited

U.S. PATENT DOCUMENTS

| | | | |
|---|---|---|---|
| 3,223,957 | 12/1965 | Cannon | 339/18 C |
| 3,670,207 | 6/1972 | Seabury | 339/18 C |
| 4,085,434 | 4/1978 | Stevens | 361/413 |

*Primary Examiner*—J. V. Truhe
*Assistant Examiner*—Morris Ginsburg
*Attorney, Agent, or Firm*—Edwin E. Greigg

[57] ABSTRACT

A program storage device which can be variably programmed manually. The device comprises for this purpose at least one printed circuit board having primary electrical contact surfaces and at least one secondary contact surface; a transverse board with a row of slits for each circuit board; and slide contacts which are designed for insertion into any of the slits in the transverse board for electrical connection, according to a desired program, with the primary and secondary contact surfaces.

21 Claims, 8 Drawing Figures

MANUALLY PROGRAMMABLE STORAGE DEVICE

BACKGROUND OF THE INVENTION

The invention relates to a program storage device that can be variably programmed manually by means of slide contact elements, or plug-in elements, with at least one printed circuit board and in particular to a manually programmable program storage device preferably for use with time control devices.

So-called cross-bar program storage devices are known, in which elongated crossing conductor paths, spaced from each other, are present on printed circuit boards. The points of intersection of the conductor paths are associated with holes in the printed circuit board, so that contact rods can be selectively inserted into the printed circuit board, whereby a manual program storage is made possible by electrically connecting vertical and horizontal conductor paths. This type of printed circuit board, however, is very expensive, because of the holes and the contacts, such as soldered junctions or the like, that are necessary at the holes for a satisfactory contact, so that the program storage is accordingly expensive.

OBJECTS OF THE INVENTION

It is, therefore, a principal object of the invention to provide a program storage device of the type mentioned above, which is substantially less expensive to produce, has a high level of operational reliability, and is especially suited for programming according to day periods or calendar periods, especially in connection with timed circuit devices for heating and air conditioning units. It can also be built compactly with a small structural height, and be so formed that it is suitable for easily modified, decoded programming.

The achievement of this object and others will become apparent from the following general and specific description dealing with certain preferred embodiments.

SUMMARY, ADVANTAGES AND SCOPE OF THE INVENTION

In the program storage device according to the invention, the printed circuit board has no holes in the contact surfaces, so that it is inexpensive and simple to produce. The slide elements or contacts are also inexpensive and simple, so that a program storage device results that is extremely cost-favorable. The slide contacts can also be easily and quickly inserted and rearranged during a programming change, by providing the transverse board of the storage device with slits having decoded labels, so that the insertion of the slide contacts can occur decoded. The program storage device of the invention also has a substantial storage capacity in a small space and is operationally reliable. In addition, it can also be formed in such a manner that it can be expanded later with regard to its storage capacity and its storage possibilities, or it can be expanded by adding corresponding additional program storage.

It is preferably provided, that each slide contact has fingers that overlap the printed circuit board on both sides, resulting in secure contact with the contact surfaces of the printed circuit board contacted thereby, and does so in the simplest manner, since here it is only necessary, that the narrowest space between the fingers when not inserted be somewhat smaller than the thickness of the printed circuit board. In this manner the contact fingers are displaced apart elastically during insertion into the printed circuit board, thereby lying snugly against the printed circuit board with elastic contact pressure.

If the slide contact is formed for only a one-sided contact against the printed circuit board, then the necessary contact pressure can be effected by suitable, secure guiding of the slide contact, for example by a sufficiently long form-fitting straight guiding in the slit of the transverse board or by a resilient pressure plate or the like.

Preferably contact surfaces can be arranged on both sides of the printed circuit board, whereby it is normally advisable to arrange all of the primary contact surfaces on the same side of the printed circuit board. In many instances then, all of the secondary contact surfaces can be arranged on the other side of the printed circuit board, or the secondary contact surfaces, perhaps of varying lengths, can be arranged on both sides of the printed circuit board.

The program storage device of the invention can have various areas of application and is especially suitable in connection with a cyclical answering circuit that is connected to the primary and secondary contact surfaces. This answering circuit cyclically reads all slide contact combinations of primary and secondary contact surfaces and responds to inserted slide contact combinations for the release of command signals or the like. Preferably the cyclical reading can be time controlled in constant time periods by a clock, whereby the clock can be preferably quartz controlled in order to insure precise accuracy over long periods of time. The clock can also be fed with a line frequency and preferably has a running reserve. There are, however, also other cyclical reading possibilities available. For example, a machine shaft of a program controlled machine can determine the reading cycle.

In some cases it can also be provided that all contact surfaces are arranged on the same side of the printed circuit board, so that the other side of the printed circuit board has no contact surfaces that can be contacted by the slide contacts. It is better, however, to provide contact surfaces on both sides of the printed circuit board, because in this manner the surfaces of the printed circuit board available for storage purposes is substantially improved and is used more space-efficiently. Each contact finger of the slide contact can advantageously have a single contact, but it is also possible to provide it with two electrically inter-connected or electrically isolated contacts, which contact different contact surfaces of the printed circuit board.

Generally it is advisable to equip the program storage device, which one could also call a switch-gear panel, with diodes forming rectifiers in the manner of a diode matrix, in order to be able to form the answering circuit simply. Thereby it is especially advantageous, to locate all necessary diodes of the program storage device in the slide contacts, so that no diodes are located on the printed circuit boards, thereby substantially simplifying the circuitry and saving costs.

One preferred area of application of the program storage device according to the invention concerns the storage of the times for raising and lowering the room temperature according to night, weekend or other calendar-related demands in buildings, which are temperature controlled by a heating or air conditioning unit, such as schools, office buildings, industrial buildings, apartment buildings, etc. One can differentiate the slide contacts that cause a temperature increase at predetermined times from slide contacts that serve to lower the temperature, preferably by color coding, so that a person can survey the correct programming at a glance. It might be effective for color coding to use red for slide contacts that serve to increase the temperature and blue for the others. It is of course also possible to differentiate these slide contacts by different shapes of their heads. The color coding of the slide contact heads, however, is more readily detectable and less expensive. The colored slide contact can be effectively injection molded out of plastic.

In order to store different circuit functions and/or in order to enlarge the storage possibilities of a printed circuit board with a given length, it can be advantageously provided, that at least two second contact surfaces are arranged parallel to each other, stacked, and extending in the long direction of the printed circuit board. One can thereby especially advantageously provide several types of slide contacts, differing from each other by various lengths of the contact fingers and/or provide that the insertion depth of the slide contact can be varied. For this purpose the slit length of the slits of at least one slit row of the transverse board can periodically vary from slit to slit, and each slide contact can have a number of stops staggered along the length of the slide contact, the number of stops corresponding to the number of varying slit lengths. The stops variably limit the depth of insertion depending on the length of the concerned slit. It can also be effective to provide several types of slide contacts, whereby the slide contacts of the same type serve to release the same circuit function at the times, etc., determined by the contacts, and those of the other type or types release other circuit functions. It can thereby be advantageous if the first contact surfaces are arranged in a common manner to the slide contacts of all types.

The individual slide contact can also be formed so that it can simultaneously effect two different circuit functions, in that it, for example, has two separated electrical contact pairs. Also successful would be only three contacts on the slide contact, to create separate current paths from a contact surface of the printed circuit board to two other contact surfaces of the printed circuit board. It is also advantageous in many cases to compare two or more such simultaneously produced, separate signals by means of a comparator, and to release different signals depending on the comparison, for example, in a time control device for heating or air conditioning devices, effecting temperature increase or temperature decrease depending on the signal comparison.

The connection of the printed circuit board to the lead and shunt lines of the answering circuit or the like can preferably occur only by insertion in a holder including connection contacts, so that no soldering joints for the connection are necessary, and one can, if necessary, replace the printed circuit board without difficulty by pulling it out of the holder and inserting a new printed circuit board. The new printed circuit board can correspond to the previous printed circuit board, in case the exchange concerns only replacing a damaged printed circuit board, or it can be a printed circuit board provided with another contact surface arrangement for the purpose of changing the programming possibilities.

In many cases a single printed circuit board is sufficient, but often it is effective and advantageous to provide several or a plurality of printed circuit boards for the program storage device. In a weekly time control program, for example, a special printed circuit board can be provided for each week day, whereby the holders for these printed circuit boards effectively have both single contacts and contact bars running across the long axis of the printed circuit board, which contact bars galvanically connect certain contact surfaces of the printed circuit boards with each other

DESCRIPTION OF THE PREFERRED EMBODIMENTS

Figures 1, 3, 4:
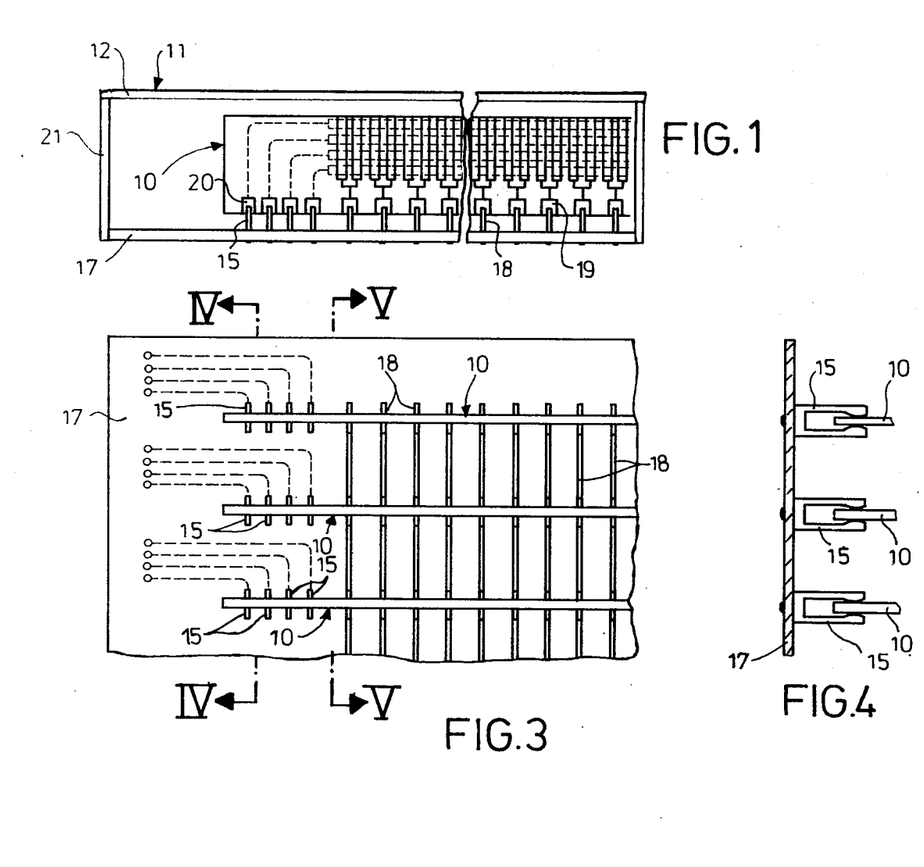
FIG. 1 illustrates a sectioned, broken front view of a program storage device according to a first exemplary embodiment of the invention.
FIG. 3 illustrates a cutaway top view of the program storage device according to FIG. 1 with a partially broken away transverse board.
FIGS. 4 and 5 are each a section through FIG. 3 taken along line IV—IV or V—V, respectively, whereby the printed circuit boards are only partially shown.
Figure 2:
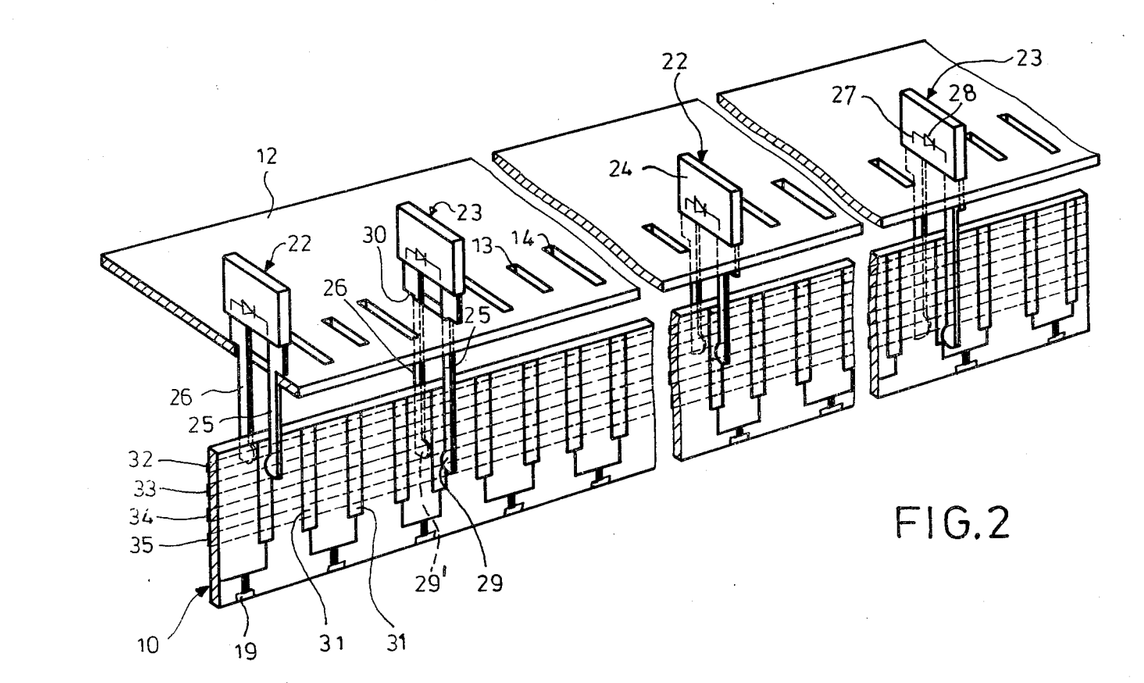
FIG. 2 illustrates a broken, cutaway and perspective view of the transverse board and a printed circuit board of the program storage device according to FIG. 1.
Figure 5:
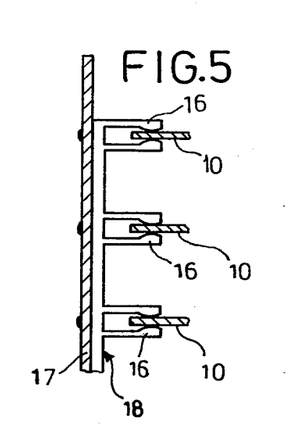
Figure 6:
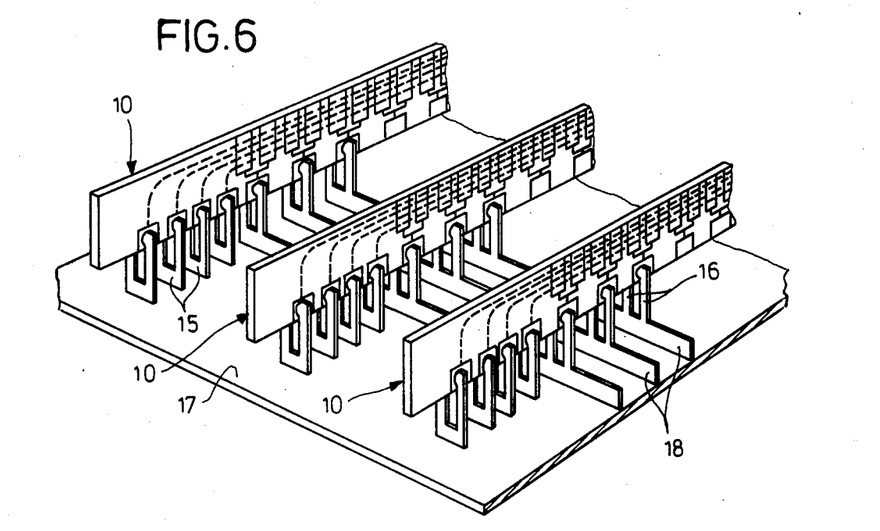
FIG. 6 is an illustrative prospective view of FIG. 3 without the side walls and transverse board of the housing of the program storage device.

The program storage device shown in FIGS. 1-6 can have seven parallel printed circuit boards 10 for programmings in accordance with weekly time periods, of which one printed circuit board in FIGS. 1 and 2 and three printed circuit boards in FIGS. 4-6 can be seen. All of the printed circuit boards 10 can be formed identically. This program storage device includes a box-shaped housing 11, whose cover forms a transverse board 12 having one row of cross slits 13, 14 per printed circuit board 10, whereby in each row short slits 13 and long slits 14 alternate with each other. Spaced beneath the transverse board 12, the printed circuit boards 10 are inserted into contact holders 15, 16, which are shaped as fork springs, to hold the printed circuit boards and establish the electrical connection. These contacts 15, 16 are arranged on a bottom board 17 of the housing 11 made of electrically insulated material, whereby the contacts 16 form parts of metallic contact bars 18 and the contacts 15 are single contacts.

None of the printed circuit boards 10 have holes. They consist of a carrier board of an electrical insulating material, and metallic conducting and contact surfaces located on both sides thereof.

On the lower front side and back side areas of the printed circuit board electrical connection contact surfaces 19, 20 are spaced next to each other. These electrical connection contact surfaces 19, 20 are contacted by the electrical connection contacts 15, 16, which alone hold the printed circuit boards. The transverse board 12 consists of electrically insulating material and is connected by side walls, such as 21, with the bottom board 17, so that the printed circuit boards 10 are found in a space that is enclosed except for the slits 13, 14. The bottom board 17 can be placed directly on top of a box, which contains a cyclical answering circuit, neither of which is shown. The answering circuit can be attached to the contacts that extend through the bottom board 17, for example, by soldering the concerned conductors.

Two types of plug-in slide contacts 22, 23 serve the programming of this program storage device. Each slide contact 22, 23 has a handle portion or grip 24, and contact fingers 25, 26 extending therefrom. The slide contacts 22 have shorter contact fingers than the slide contacts 23. For example, the slide contacts 22 have red colored grips 24 and the slide contacts 23 have blue colored grips 24. The two types will therefore now be designated as red and blue slide contacts 22 and 23. The following further explanation will refer to the preferred area of application of this program storage device, namely a time control device for alternately turning on the day increase and the night decrease of the room temperature of rooms of a building heated by a heating device. It should be understood, however, that this program storage device can also have other areas of application.

The two metallic contact fingers 25, 26 are inserted into the plastic grip 24 of each slide plug 22, 23, and are interconnected with a rectifying diode 28 by an electrical line 27, both shown symbolically in FIG. 2. These two contact fingers 25, 26 extend in the longitudinal central plane of the grip 24 parallel to each other from the grip downward, and are provided on their free ends with contact projections 29, 29' pointing toward each other, whose inside separation is somewhat smaller than the thickness of the printed circuit board 10, so that these contact projections 29, 29' come into secure resilient contact with the contact surfaces of the printed circuit board 10 contacted by them.

These slide contacts 22, 23 are inserted (plugged in) up to a desired stop in slits 13, 14 in the transverse board 12, and are guided in a straight line by form fitting in the respective slits 13, 14. The grip 24 extends outwardly over the two contact fingers 25, 26 in such a manner that the lower frontal side of the grip 24 always limits the insertion depth of the slide contacts 22 or 23 by lying against the transverse board 12 when the slide contacts 22, 23 is inserted into one of the long slits 14. Each of the contact fingers 25, 26 has a step-like recess or step 30 at the same distance below the grip 24. These steps 30 decrease the depth of insertion of the slide contacts 22, 23 when it is inserted into a short slit 13 of the transverse board 12, because these steps 30 then abut the transverse board.

On the front side of each printed circuit board 10 are elongated primary contact surfaces 31 spaced at equal parallel distances to each other. In this manner each such primary contact surface 31 is set vertical to the long direction of the printed circuit board, and each extends from the upper long edge of the printed circuit board far enough downward that the contact projection 29 of the front contact finger 25 of each slide contact 22, 23 securely contacts the primary contact surface 31 beneath the concerned slit 13, 14 at every possible depth. The primary contact surfaces 31 are galvanically connected in pairs, as shown, so that the number of connection contact surfaces 19 for the primary contact surfaces 31 corresponds to only half the number of the primary contact surfaces 31. Accordingly, a corresponding number of contact bars 18 is saved for the primary contact surfaces 31 of the printed circuit boards 10.

On the back side of each printed circuit board 10, parallel to their long direction and parallel to each other, are arranged four secondary contact surfaces 32 through 35, each of which is galvanically connected with one of the connecting contact surfaces 20 contacted by single contacts 15, and each of which are formed as elongated contact bars extending over the length of the row of the primary contact surfaces 31. The secondary contact surfaces 32–35, however, are not electrically connected with these primary contact surfaces, since the carrier board of the printed circuit board 10 insulates the primary contact surfaces 31 from the secondary contact surfaces 32–35.

In this preferred exemplary embodiment let it be supposed, that 48 primary contact surfaces 31 are present per printed circuit board, so that by means of each printed circuit board 10 a time control program can be programmed for 24 hours with half hour intervals between neighboring program timed control points. Each long slit 14 of the transverse board 12 is associated with a full hour time period. The slits 13, 14 of each slit row can then be consecutively listed with 12:00 o'clock a.m., 12:30 o'clock a.m., 1:00 o'clock a.m., 1:30 o'clock a.m. . . . 23:00 o'clock p.m., 23:30 o'clock p.m. Each of the seven slit rows and thereby each of the seven printed circuit boards 10 is associated with a different weekday, so that a full week program can be programmed.

All of the slide contacts 22, 23 can be selectively inserted into short or long slits 13, 14. The slide contacts 22 with the shorter contact fingers 25, 26 serve to turn on the temperature increase cycle and the slide plugs 23 with the longer contact fingers 25, 26 turn on the temperature decrease cycle.

As mentioned, the front contact fingers 25 of the slide contacts 22, 23 continually contact primary contact surfaces 31 located beneath the concerned slit 13, 14. The rear contact fingers 26 of the slide contacts 22, 23, meanwhile contact one of the secondary contact surfaces 32–35, namely as follows:

When a red slide contact 22 is inserted into a short slit 13, its rear contact finger 26 contacts the upper secondary contact surface 32 and when it is inserted into a long slit 14, it contacts the secondary contact surface 33 second from the top. The rear contact finger 26 of a blue slide contact 23 contacts the secondary contact surface 34 second from the bottom when inserted into a short slit 13, and when inserted into a long slit 14, it contacts the bottom secondary surface 35. The answering circuit, which is not shown here and which effects the program storage device, can then be formed to operate as follows:

At 12:00 o'clock midnight, the answering circuit passes a positive voltage to the outer left contact bar 18, as viewed with reference to FIG. 6, and thereby passes positive voltage to the outer left primary contact surface pair 31 of all of the printed circuit boards 10, and negative voltages pass to the two secondary contact surfaces 33, 35 of the printed circuit board 10 associated with the weekday concerned. At 12:30 a.m. the negative voltages are turned off on the contact surfaces 33, 35 of this printed circuit board 10 and turned on on the secondary contact surfaces 32, 34. At 1:00 a.m. the positive voltage is transferred to the next contact bar 18 and thereby to the neighboring primary contact surface pair 31. At the same time the negative voltages are transferred back to the secondary contact surfaces 33, 35, etc., until 23:00, whereupon this answering circuit starts on the next printed circuit board 10 for the next weekday until all of the printed circuit boards 10 have read, whereupon this weekly cycle repeats itself.

Each of the two contact surfaces 32, 33, then, is always conducting electric current, when loaded with negative voltage and electrically connected by a red slide contact 22 with a primary contact surface 31 receiving positive voltage. In this manner, at the beginning of any full or half hour of the weekday concerned, a signal is released that turns on the heat. The other two contact surfaces 34, 35 of each printed circuit board 10 serve to turn on the lowering of the temperature at times determined by the blue slide contacts 23 in a corresponding manner. Each engaged temperature increase or decrease remains engaged until the next temperature lowering or raising is released, so that they are alternately engaged.

Red and blue slide contacts must therefore alternate with each other in the weekly program, which can be visually controlled at a glance.

Because the time between successive temperature increases and decreases in heating devices is usually much larger than half an hour, it can occur that despite the simultaneous activation of two neighboring primary contact surfaces 31, no commanding switches are made.

One sees from the above description, that the presence of four secondary contact surfaces 31-35 makes the determination between the full hour and half hour periods and between the two different circuit functions, and makes possible the galvanic common circuit of two neighboring primary contact surfaces 31, whereby with an additional expenditure for 14 single contacts 15 (FIG. 4) 24 contact bars 18 are saved. In connection hereto are also the varying lengths of the slits 13, 14 for different depths of insertion of the slide contacts 22, 23, whereby the number of types of different slide contacts 22, 23 is reduced to two.

It is also possible, however, with an increased expense, to control each primary contact surface 31 of a printed circuit board 10 separately through the answering circuit. Thereby one ends up with two secondary contact surfaces per printed circuit board 10 and can form all of the slits of the transverse board 12 with a uniform length.

The transverse board 12 can advantageously be inscripted on each slit row with the weekday concerned and at every slit with the time concerned. When, for example, a red slide contact 22 is inserted for Monday, at 5:00 a.m., the increase in temperature begins on every Monday at exactly 5:00 o'clock and remains engaged until the answering circuit switches at the following weekly time period, which is marked by the insertion of a blue slide contact 23. When, for example, a blue slide contact is inserted for Monday at 6:30 p.m., the following decrease in temperature will occur exactly on Monday at 6:30 p.m., etc. Thus, as a further example, one can program daily night decreases from Monday evening to Friday morning, and weekend decreases from Friday evening to Monday morning.

As one can easily see, even longer calendar-related programming can be achieved, when the additional printed circuit boards are provided, which, for example, are controlled by the answering circuit in predetermined periods during a year, such as during the school vacation, or on holidays, in place of the weekday printed circuit boards 10.

Figure 7:
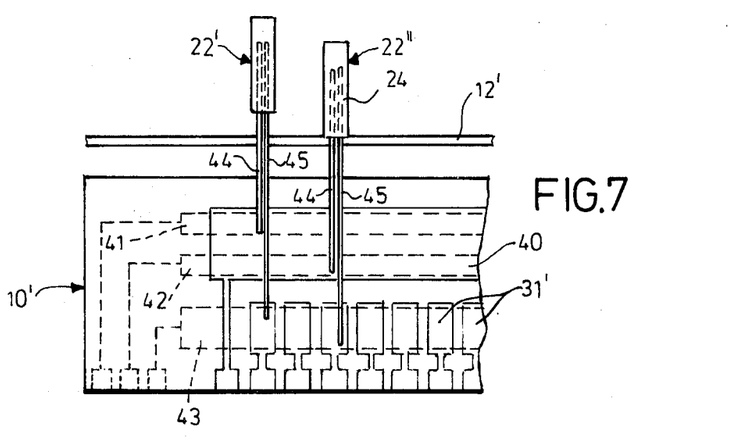
FIG. 7 illustrates a section of a printed circuit board in front view with a cutaway of a transverse board and two slide contacts of a program storage device that is not shown in more detail, according to a second exemplary embodiment of the invention.

The exemplary embodiment of the printed circuit board 10' according to FIG. 7 differs from the printed circuit board 10 in the exemplary embodiment according to the FIGS. 1-6, in that it has an additional broad secondary contact surface 40 on the front side of the circuit board having the primary contact surfaces 31'. The contact surface 40 is above the row of primary contact surfaces and extends along the length of this row of primary contact surfaces. The primary contact surfaces 31' are not connected with each other in pairs in the embodiment, but rather are individually connected. On the back side, the printed circuit board 10' has three parallel secondary contact surfaces 41-43, which also extend along the length of the row of primary contact surfaces 31', galvanically separated therefrom by the carrier board. All of the slide contacts 22', 22" in this exemplary embodiment are formed identically, each with two U-shaped fork contacts 44, 45 of varying length injected into the grips 24. These fork contacts 44, 45 can also advantageously contain intermediate diodes between their two contact fingers. Again, there are alternating short and long slits in the transverse board 12' above the printed circuit board 10', and there are also again two recesses present on each slide contact 22', 22", which cause the different depth of insertion according to the short or long slit. This can serve in distinguishing full and half hours or also other purposes.

In the exemplary embodiment according to FIG. 7 the slide contact 22' is inserted in such a manner, that it delivers a data value associated with the contact surfaces 31' and 43 and a data value associated with contact surfaces 40, 41 at the time associated with the slit containing it. The other inserted slide contact 22" delivers certain data values through the contact surface pairs 31', 43 and 40, 42 at its specified time. The two data values can be used separately or compared by means of a comparator, whereby in the latter instance a signal is only released, for example, when both data values occur simultaneously.

Figure 8:
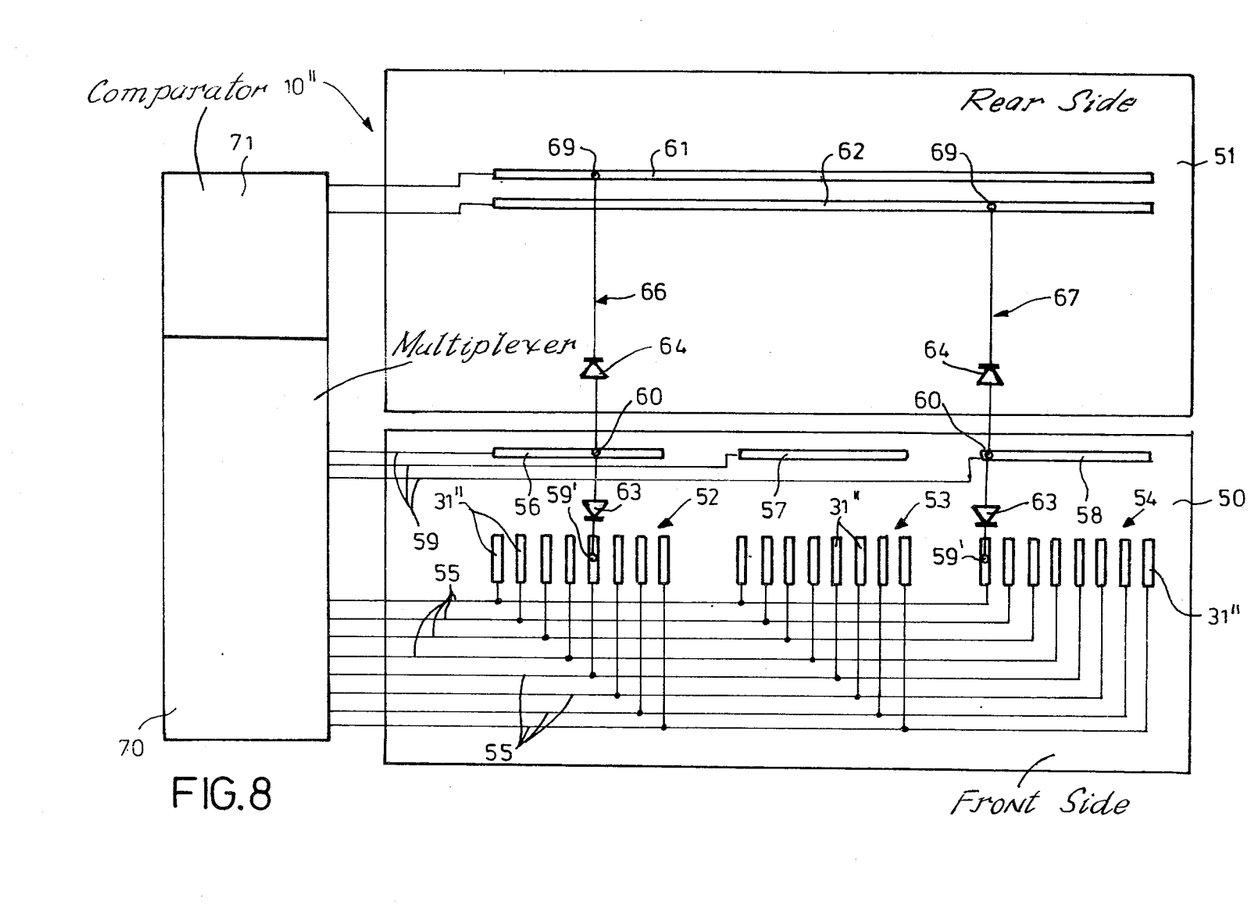
FIG. 8 illustrates a section of the front side and the back side of a printed circuit board with two symbolically indicated slide contacts of a program storage device, that is not shown in further detail, according to a further exemplary embodiment of the invention, whereby the associated answering circuit is indicated by blocks.

In the exemplary embodiment according to FIG. 8 the front side 50 and the back side 51 of a printed circuit board 10" are represented. The primary contact surfaces 31" located on the front side 50 are divided into three groups of eight 52-54, whose contact surfaces as shown are connected only to eight distributing lines 55, so that the nth contact (n=1, 2 ... 8) of the contact groups 52, 53, 54 are simultaneously activated. This printed circuit board 10", too, can be associated with a time control device for room temperature increases and decreases, as explained below. One each of two different types of slide contacts (red and blue) is symbolized by its contacts, leads, and diodes, and is designated as 66 or 67.

Preferably, the lines 55 can be successively exposed to negative voltage in eight hour cycles by an answering circuit, so that the reading change from line 55 to line 55 takes place at hourly periods. The 24 primary contact surfaces 31" can then correspond to the full 24 hours a day. On the front side 50 of the printed circuit board 10" an elongated secondary contact surface 56, 57, 58 is located, spaced above each contact surface group 52, 53, 54. Each of these elongated secondary surfaces 56, 57, 58 extends along the length of its associated contact group 52, 53, 54, and is connected to different leads 59, whereby the contact surface 56 is connected to positive voltage during the first eight hours, the contact surface 57 during the second eight hours and the contact surface 58 during the last eight hours of a day, and are disengaged the remainder of the time.

All of the slide contacts 66, 67, have three contact fingers apiece to contact the front and back side 50, 51 of the printed circuit board 10", and can be inserted equally deep into slits of a transverse board (not shown). Two of these contact fingers of the slide contacts 66, 67 concerned come into contact with a primary contact surface 31" with their contacts 59', 60, and a secondary contact surface 56, 57 or 58, and are interconnected by means of a diode 63. The third contact finger in a red slide contact 66 contacts a secondary contact surface 61 with its contact 69, which secondary contact is associated with an increase of the room temperature. In a blue slide contact 67, the contact 69 contacts a secondary contact surface 62 that is associated with a room temperature decrease. Each contact 69 is connected with the associated contact 60 by means of a diode 64.

The contact surfaces 61, 62 run in the long direction of the printed circuit board, are parallel to each other and extend along the length of all primary contact groups 52, 53, 54. The contact surfaces 61, 62 are separated from the contact groups 52, 53 and 54 by the insulating carrier board of the printed circuit board 10". The two secondary contact surfaces 61, 62 can be continually connected to negative voltage. The cyclical activation of the leads 55 and 59 proceeds by means of a multiplexer 70, which has a clock. Because the secondary contact surfaces 61, 62 are continually activated, a comparator 71 is also contemplated. The comparator 71 generates a signal to release the concerned circuit function and is only delivered to the concerned switch, when a voltage is applied by the multiplexer 70 to the primary contact surface 31" contacted by the concerned slide contacts 66, 67. The illustrated program storage device allows programming at time intervals only of at least eight hours, because otherwise faulty control would occur. For time control devices for heating buildings, that is normally fully sufficient.

For instance where time intervals shorter than eight hours are to be programmed, one can, for example, associate the printed circuit board 10" to twelve hours of the day, and for the second twelve hours provide a second such printed circuit board 10" and/or as in the exemplary embodiment according to the FIGS. 1-6, provide four secondary contact surfaces on the back side of the printed circuit board, which alternate in pairs receiving voltage in a predetermined time cycle. Or one can divide each of the two secondary contact surfaces 61, 62 into, for example, six equally long contact surfaces, whereby every other contact surface of each such contact surface row are subjected to potential during the reading of the primary contact surfaces 31" associated therewith, as are the other contact surfaces of these two contact surface rows in the intervening time intervals. A further division of these secondary contact surfaces is also possible, of course, in case one desires to allow the programming of even shorter time intervals. Or one can build an AND gate into each slide contact, which only makes possible the release of a circuit function when its two leads which lead to a primary contact surface 31" and a secondary contact surface 61 or 62, are simultaneously activated. Other possibilities are of course also possible.

What is claimed is:

1. A program storage device which can be variably manually programmed, comprising:
   a housing;
   at least one elongated printed circuit board mounted within the housing, and having: a plurality of primary electrical contact surfaces arranged adjacently and in at least one row in the longitudinal direction of the circuit board; and at least one secondary contact surface that extends in the longitudinal direction of the circuit board;
   a transverse board serving as the top wall of the housing and having a row of slits formed therein for each circuit board, each row being longitudinally aligned with its respective circuit board; and
   a plurality of slide contacts each having interconnected electrical contacts, said slide contacts being constructed for insertion into the slits formed in the transverse board and for support by the transverse board, such that the interconnected electrical contacts electrically connect at least one primary and at least one secondary contact surface of the printed circuit board, wherein the openings of the slits in at least one row of slits vary in a periodic fashion along the extent of said at least one row, and wherein each slide contact has a number of staggered step regions situated in the longitudinal direction of the slide contact, which number corresponds to the number of different slit openings of said slits, said step regions serving to limit the insertion depth of said slide contact.

2. The program storage device according to claim 1, further comprising:
   an answering circuit connected to the contact surfaces of each printed circuit board, said answering circuit cyclically reads all combinations of primary and secondary contact surfaces that can be formed by the plurality of slide contacts and responds to the inserted combination.

3. The program storage device according to claim 2, wherein the answering circuit includes a clock which controls its cyclical operation.

4. The program storage device according to claim 1, wherein the primary contact surfaces are associated with at least one secondary contact surface.

5. The program storage device according to claim 1, wherein each circuit board has a single row of primary contact surfaces.

6. The program storage device according to claim 1, wherein the at least one secondary contact surface is located on the same side of the circuit board as the primary contact surfaces, said at least one secondary contact surface extending above and in the direction of a row of primary contact surfaces.

7. The program storage device according to claim 1, wherein the at least one secondary contact surface extends along the length of a row of primary contact surfaces.

8. The program storage device according to claim 1, wherein the interconnected electrical contacts of each slide contact lie opposite one another, each of the interconnected electrical contacts contacting opposite sides of the circuit board.

9. The program storage device according to claim 8, wherein each slide contact has two interconnected electrical contacts connected by a diode.

10. The program storage device according to claim 8, wherein each slide contact has three interconnected electrical contacts, and wherein one of the three interconnected electrical contacts is connected with the other two interconnected electrical contacts by diodes.

11. The program storage device according to claim 8, wherein at least one slide contact has two pairs of interconnected electrical contacts.

12. The program storage device according to claim 1, wherein the openings of the slits in said at least one row of slits vary in length in a periodic fashion along the extent of said at least one row, and wherein the number of staggered step regions situated in the longitudinal direction of each slide contact corresponds to the number of different slit lengths of said slits.

13. The program storage device according to claim 1, wherein the plurality of primary electrical contact surfaces are elongated, and wherein the elongated extent of the primary contact surfaces is directed at an angle to the longitudinal axis of the circuit board.

14. The program storage device according to claim 1, further comprising:
a plurality of contact holders for holding the circuit board, wherein each circuit board further has a plurality of electrical connection contact surfaces galvanically connected to the primary and secondary contact surfaces, and wherein the contact holders engage the electrical connection contact surfaces and provide a connection of the electrical connection contact surfaces with the primary and secondary contact surfaces.

15. The program storage device according to claim 1, wherein at least one printed circuit board serves for programming over a twenty-four hour period, and wherein a primary contact surface serves for programming a predetermined time period.

16. The program storage device according to claim 15, further comprising:
an answering circuit connected to the contact surfaces of each printed circuit board, and wherein seven circuit boards are provided, one for each day of the week, with the answering circuit cyclically controlling the seven circuit boards.

17. The program storage device according to claim 1, wherein said at least one circuit board further has a plurality of distributing lines, wherein the plurality of primary contact surfaces are divided into several groups of primary contact surfaces, each group being associated with an equally long, successive time period, wherein each primary contact surface group is associated with a secondary contact surface which extends over the length of the primary contact surface group, wherein the number of distributing lines corresponds to the number of primary contact surfaces in each group, and wherein each distributing line is connected to a primary contact surface in each group.

18. The program storage device according to claim 1, wherein two secondary contact surfaces are provided, which serve to release different commands.

19. The program storage device according to claim 1, wherein the plurality of primary contact surfaces are divided into pairs corresponding to adjacent time periods, with contact surfaces in each pair being galvanically connected to each other, and wherein for each type of releasable switching procedure two secondary alternatively controllable contact surfaces are provided, of which one secondary contact surface is turned on at time periods associated with certain contact surfaces of the primary contact surface pairs, and the other is turned on at time periods associated with the other contact surfaces of the primary contact surface pairs.

20. The program storage device according to claim 1, wherein variously formed slide contacts are provided for the storage of different circuit functions.

21. The program storage device according to claim 1, wherein two groups of slide contacts are provided with the electrical contacts of one group of slide contacts being longer than the electrical contacts of the other group.

* * * * *